(12) United States Patent
Aikawa et al.

(10) Patent No.: US 6,715,115 B1
(45) Date of Patent: Mar. 30, 2004

(54) SEMICONDUCTOR INTEGRATED CIRCUIT DEVICE CAPABLE OF OUTPUTTING LEADING DATA OF A SERIES OF MULTIPLE BURST-READOUT DATA WITHOUT DELAY

(75) Inventors: Tadao Aikawa, Kawasaki (JP); Yasuharu Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 532 days.

(21) Appl. No.: 09/615,953

(22) Filed: Jul. 13, 2000

(30) Foreign Application Priority Data

Jul. 14, 1999 (JP) .......................................... 11-199951

(51) Int. Cl.$^7$ .............................................. G11C 29/00
(52) U.S. Cl. ...................................... 714/718; 714/701
(58) Field of Search .............................. 714/718, 699, 714/702, 746, 742, 723, 700, 701; 365/201; 324/765

(56) References Cited

U.S. PATENT DOCUMENTS

| | | | | |
|---|---|---|---|---|
| 4,811,299 A | * | 3/1989 | Miyazawa et al. | 365/201 |
| 5,241,500 A | * | 8/1993 | Barth et al. | 365/189.01 |
| 5,331,596 A | * | 7/1994 | Miyazawa et al. | 365/201 |
| 5,377,144 A | * | 12/1994 | Brown | 365/189.02 |
| 5,920,201 A | * | 7/1999 | Mehrotra et al. | 324/765 |

* cited by examiner

Primary Examiner—Albert Decady
Assistant Examiner—Mujtaba Chaudry
(74) Attorney, Agent, or Firm—Arent Fox Kintner Plotkin & Kahn, PLLC

(57) ABSTRACT

A semiconductor device including a parallel to serial conversion circuit that receives first through $n^{th}$ data (where n is an integer greater than or equal to 2), together with $(n+1)^{th}$ data, in parallel to each other, and that outputs the first through $n^{th}$ data in series in this order via first through $n^{th}$ paths in a first operating mode, while it outputs the (n+1)th data via one of the second through $n^{th}$ paths in a second operation mode. An output control circuit is connected to the parallel to serial conversion circuit via the first through nth paths, the output control circuit successively outputting the first through $n^{th}$ data in the first operating mode, and outputting only the $(n+1)^{th}$ data supplied from the parallel to serial conversion circuit in the second operating mode.

6 Claims, 13 Drawing Sheets

SEMICONDUCTOR INTEGRATED CIRCUIT DEVICE CAPABLE OF OUTPUTTING LEADING DATA OF A SERIES OF MULTIPLE BURST-READOUT DATA WITHOUT DELAY

BACKGROUND OF THE INVENTION

1. Field of the Invention

The present invention generally relates to semiconductor integrated circuit devices, and more particularly to a semiconductor integrated circuit device in which parallel data output from an internal circuit (for example, a memory cell area) is converted into serial data, which is output to the outside of the device via a data output circuit.

2. Description of the Related Art

FIG. 1 is a circuit diagram of part of an example of a conventional DRAM (Dynamic Random Access Memory), which includes a data switch circuit 1, an output buffer circuit 2, and a pad 3 serving as an external connection terminal.

The data switch circuit 1 is controlled by a select signal SEL. At the time of a normal mode, read data RD read our from a memory cell area is selected, and is transmitted to an output buffer circuit 2. At the time of a test mode, test data TD (which is, for example, internal information indicating the burst length) is selected output from a part other than the memory cell area, and is transmitted to the output buffer circuit 2.

The output buffer circuit 2 is set to an output enable state by an output enable signal OEN, and outputs, as output data DOUT, the real data RD or test data TD output from the data switch circuit 1 to the pad 3 in synchronism with the timing of a falling edge of an output clock signal OCLK.

The output buffer circuit 2 includes an output transistor circuit 4, which functions to output the output data DOUT to the pad 3. The output transistor circuit 4 is made up of a PMOS (P-type Metal Oxide Semiconductor) transistor 5 serving as a pull-up element, and an NMOS (N-channel MOS) transistor 6 serving as a pull-down element.

An output transistor control circuit 7, which supplies a pull-up signal PU and a pull-down signal PD to the gates of the PMOS and NMOS transistors 5 and 6, respectively, so that the transistors 5 and 6 can be turned ON/OFF.

FIG. 2 is a circuit diagram of a configuration of the data switch circuit 1, which is made up of NAND circuits 8, 10 and 11, and inverters 89 and 12. The NAND circuit 8 performs a NAND operation on the select signal SEL and the test data TD. The inverter inverts the select signal SEL. The NAND circuit 10 performs a NAND operation on the output of the inverter 9 and the real data RD. The NAND circuit 11 performs a NAND operation o the outputs of the NAND circuits 8 and 10. The inverter 12 inverts the output of the NAND circuit 11, and outputs an output D1 of the data switch circuit 1.

The select signal SEL is at a low (L) level at the time of reading data in the normal mode, and is at a high (H) level at the time of the test mode. When the select signal is at L, the output of the NAND circuit 8 is at H, and the output of the inverter 9 is at H. Thus, the NAND circuit 10 functions as an inverter with respect to the real data RD, and the NAND circuit 11 functions as an inverter with respect to the output of the NAND circuit 10. As a result, the real data RD is selected.

When the select signal SEL is at H, the output of the inverter 9 is at L, and the output of the NAND circuit 10 is at H. Thus, the NAND circuit 8 functions as an inverter with respect to the test data TD, and the NAND circuit 11 functions as an inverter with respect to the output of the NAND circuit 8. As a result, the test data TD is selected.

FIG. 3 is a circuit diagram of the output transistor control circuit 7, which includes a pull-up signal generating circuit 13 which generates the pull-up signal PU, and a pull-down signal generating circuit 14 which generates the pull-down signal PD.

The pull-up signal generating circuit 13 is made up of a NAND circuit 15, an inverter 16, a transfer gate circuit 17, a PMOS transistor 18, and an NMOS transistor 19. The NAND circuit 15 performs a NAND operation on the output enable signal OEN and an output D1 of the data switch circuit 1. The inverter 16 inverts an output clock signal OCLK. The PMOS transistor 18 is turned ON/OFF by the output clock signal OCLK.

The NMOS transistor 19 is turned ON/OFF by the output of the inverter 16.

Further, the pull-up signal generating circuit 13 includes a latch circuit 20, and an inverter 23. The latch circuit 20 is made up of inverters 21 and 22, and latches the output of the NAND circuit 15 via the transfer gate circuit 17. The inverter 23 inverts the output of the latch circuit 20, and thus produces the pull-up signal PU.

The pull-down signal generating circuit 14 includes an inverter 24, and a NOR circuit 25. The inverter 24 inverts the output enable signal OEN. The NOR circuit 25 performs a NOR operation on the output of the inverter 24 and the output D1 of the data switch circuit 1.

Further, the pull-down signal generating circuit 14 includes an inverter 26, a transfer gate circuit 27, a PMOS transistor 28, and an NMOS transistor 29. The inverter 26 inverts the output clock signal OCLK. The PMOS transistor 28 is turned ON/OFF by the output clock signal OCLK. The NMOS transistor 29 is turned ON/OFF by the output of the inverter 26.

Furthermore, the pull-down signal generating circuit 14 includes a latch circuit 30, and an inverter 33. The latch circuit 30 is made up of inverters 31 and 32, and latches the output of the NOR circuit 25 via the transfer gate circuit 27. The inverter 33 inverts the output of the latch circuit 30, and thus produces the pull-down signal PD.

In the output transistor control circuit 7 thus configured, when the output enable signal OEN is at L, the output of the NAND circuit 15 is at H, and the output of the inverter 24 is at H, while the output of the NOR circuit 25 is at L.

In this case, when the output clock signal OCLK switches to L, the transfer gate circuits 17 and 27 are turned ON, so that the output of the latch circuit 20 is changed to L, and the pull-up signal PU is changed to H. The output of the latch circuit 30 is switched to H, and the pull-down signal PD is switched to L.

Thus, when the output clock signal OCLK switches to L in the state in which the output enable signal OEN is at L, the PMOS transistor 5 is turned OFF, and the NMOS transistor 6 is turned OFF. Consequently, the output buffer circuit 2 is changed to a high-impedance state.

In contrast, when the output enable signal OEN is at H, the NAND circuits 15 and NOR circuit 25 respectively function as inverters with respect to the output D1 of the data switch circuit 1.

In the above case, when the output D1 of the data switch circuit 1 is H, the output of the NAND circuit 15 is at L, and the output of the NOR circuit 25 is at L. In these states, when the output clock signal OCLK switches to L, the transfer gate circuits 17 and 27 are turned ON. Thus, the output of the latch circuit 20 is switched to H, and the pull-up signal PU is switched to L. Further, the output of the latch circuit 30 is changed to H, and the pull-down signal PD is changed to L.

Thus, in the above case, the PMOS transistor 5 is turned ON, and the NMOS transistor 6 is OFF, while the output data DOUT is H. Thus, H which is the output D1 of the data switch circuit 1 is output.

In contrast, when the output D1 of the data switch circuit 1 is at L, the output of the NAND circuit 15 is at H, and the output of the NOR circuit 25 is at H. In these states, when the output clock signal OCLK switches to L, the transfer gate circuits 17 and 27 are turned ON. Thus, the output of the latch circuit 20 is switched to L, and the pull-up signal PU is switched to H. Further, the output of the latch circuit 30 is switched to L, and the pull-down signal PD is switched to H.

Thus, in the above case, the PMOS transistor 5 is turned OFF, and the NMOS transistor 6 is turned ON. The output data DOUT becomes L, and L which is the output D1 of the data switch circuit 1 is output.

FIG. 4 is a waveform diagram illustrating an operation of the DRAM shown in FIG. 1 at the time of reading data in the normal mode. Part A of FIG. 4 shows the external clock signal CLK supplied from the outside of the DRAM, and part B shows the select signal SEL. Part C shows the real data RD, and part D shows the output D1 of the data switch circuit 1. Part E shows the output clock signal OCLK, and part F shows the output enable signal OEN. Part G shows the output data DOUT.

At the time of read in the normal mode, the select signal SEL is set at L, so that the data switch circuit 1 can select the real data RD, which is transmitted to the output buffer circuit 2 via the data switch circuit 1.

The output buffer circuit 2 is changed to an output enable state when the output enable signal OEN switches to H. In this state, when the output clock signal OCLK falls, the real data RD is output to the pad 3 as output data DOUT.

FIG. 5 is a waveform diagram illustrating an operation of the DRAM shown in FIG. 1 at the time of the test mode. Part A of FIG. 5 shows the external clock signal CLK, and part B thereof shows the select signal SEL. Part C shows the test data TD, and part D shows the output D1 of the data switch circuit 1. Part E shows the output clock signal OCLK, and part F shows the output enable signal OEN. Part G shows the output data DOUT.

At the time of the test mode, the select signal SEL is switched to H, so that the data switch circuit 1 is set to a state in which the data switch circuit 1 can select the test data TD. Thus, the test data TD is transferred to the output buffer circuit 2 via the data switch circuit 1.

The output buffer circuit 2 is set to an output enable state when the output enable signal OEN switches to H. In this state, when the output clock signal OCLK falls, the test data TD is output to the pad 3 as the output data DOUT.

FIG. 6 is a block diagram of another part (an essential part of data output circuit) of the DRAM, in which there are illustrated a PS (Parallel-to-Serial) conversion circuit 35, an output buffer circuit 36, and a pad 37 serving as an external connection terminal.

The PS conversion circuit 35 is controlled by the select signal SEL and PS conversion control signals PSCLK1 and PSCLK2. At the time of read in the normal mode, real data RD1 and RD2 arranged in parallel formation are applied to the circuit 35, which serially outputs the real data RD1 and RD2 to the output buffer circuit 36 in this order as outputs PSD1 and PSD2 of the PS conversion circuit 35. At the time of the test mode, the tes data TD is applied to the circuit 35, which transfers the received test data TD to the output buffer circuit 36 as the outputs PSD1 and PSD2 of the circuit 35.

The output buffer circuit 36 is controlled by the output enable signals OEN1 and OEN2, and outputs the outputs PSD1 and PSD2 of the PS conversion circuit 35 to the pad 37 as output data DOUT in synchronism with the falling edges of the respective output clock signal OCLK1 and OCLK2.

The output buffer circuit 36 includes an output transistor circuit 38, and an output transistor control circuit 41. The output transistor circuit 38 outputs the output data DOUT to the pad 37. The output transistor circuit 38 is made up of a PMOS transistor serving as a pull-up transistor, and an NMOS transistor serving as a pull-down transistor.

The output transistor control circuit 41 supplies the pull-up signal PU and the pull-down signal PD to the gates of the PMOS transistor 39 and the NMOS transistor 40, respectively, which are thus turned ON/OFF.

FIG. 7 is a circuit diagram of the PS conversion circuit 35, which includes an inverter 43, a NAND circuit 44, and an inverter 45. The inverter 43 inverts the select signal SEL. The NAND circuit 44 performs a NAND operation on the output of the inverter 43 and the PS conversion control signal PSCLK1. The inverter 45 inverts the output of the NAND circuit 44.

The PS conversion circuit 35 further includes transfer gate circuits 46 and 47. The transfer gate circuit 46 is turned ON/OFF by the output of the NAND circuit 44 and the output of the inverter 45, and thus control to transfer the real data RD1. The transfer gate circuit 47 is turned ON/OFF by the output of the NAND circuit 44 and the output of the inverter 45, and thus control to transfer the real data RD2.

Furthermore, the PS conversion circuit 35 includes an inverter 48, a NAND circuit 49, an inverter 50, and transfer gate circuits 51 and 52. The inverter 48 inverts the output of the inverter 43. The NAND circuit 49 performs a NAND operation on the output of the inverter 48 and the PS conversion control signal PSCLK1. The inverter 50 inverts the NAND circuit 49.

The transfer gate circuits 51 and 52 are turned ON/OFF by the output of the NAND circuit 49 and the output of the inverter 50, and thus control to transfer the test data TD.

The PS conversion circuit 35 includes a latch circuit 53, which is made up of inverters 54 and 55. The circuit 35 latches the real data RD1 or the test data TD, and outputs the latched output PSD1.

The PS conversion circuit 35 includes a latch circuit 56, an inverter 59, and a transfer gate circuit 60. The latch circuit 56, which is made up of inverters 57 and 58, latches the real data RD2 or the test data TD. The inverter 59 inverts the PS conversion control signal PSCLK2. The transfer gate circuit 60 is turned ON/OFF by the output of the PS conversion control signal PSCLK2 and the output of the inverter 59.

The PS conversion circuit 35 includes a latch circuit 61, and an inverter 64. The latch circuit 61, which is made up of inverters 62 and 63, latches the output of the latch circuit 56 via the transfer gate circuit 60. The inverter 64 inverts the output of the latch circuit 61, and thus outputs PSD2 of the circuit 35.

In the PS conversion circuit 35 thus configured, when the select signal SEL is at L, the output of the inverter 43 is at H, and the NAND circuit 44 functions as an inverter with respect to the PS conversion control signal PSCLK1. The output of the inverter 48 at L, and the output of the NAND circuit 49 at H. Further, the output of the inverter 50 at L, so that the transfer gate circuits 51 and 52 are OFF.

In the above state, when the PS conversion control signal PSCLK1 switches to H while the PS conversion control signal PSCLK2 is maintained at L, the output of the NAND circuit 44 is switched to L, and the output of the inverter 45 is switched to H. Thus, the transfer gate circuits 46 and 47 are turned ON, and the real data RD1 and RD2 are respectively latched in the latch circuits 53 and 56. The output of the latch circuit 53 is output as the output PSD1 of the PS conversion circuit 35.

Thereafter, when the PS conversion signal PSCLK1 switches to L, and the PS conversion control signal PSCLK2 switches to H, the output of the NAND circuit 44 is changed to H, and the output of the inverter 45 is changed to L. Thus, the transfer gate circuits 46 and 47 are turned OFF, while the transfer gate circuit 60 is turned ON. As a result, the output of the latch circuit 56 is latched in the latch circuit 61, and the output of the inverter 64 obtained by inverting the output of the latch circuit 61 is output as output PSD2 of the PS conversion circuit 35.

When the select signal SEL is at H, the output of the inverter 43 is at L, and the output of the NAND circuit 44 at the H. The output of the inverter 45 is at L. Thus, the transfer gate circuits 46a and 47 are OFF, and the output of the inverter 48 is H. The NAND circuit 49 functions as an inverter with respect to the PS conversion control signal PSCLK1.

In the above state, when the PS conversion control signal PSCLK1 switches to H while the PS conversion control signal PSCLK2 is maintained at L, the output of the NAND circuit 49 is switched to L, and output of the inverter 50 is switched to H. Thus, the transfer gate circuits 46 and 47 are turned OFF, and the transfer gate circuit 60 is turned ON. Thus, the output of the latch circuit 56 is latched in the latch circuit 61. The output of the inverter 64 obtained by inverting the output of the latch circuit 61 is output as output PSD2 of the PS conversion circuit 35.

FIG. 8 is a circuit diagram of a configuration of the output transistor control circuit 41, which includes a pull-up signal generating circuit 66 for generating the pull-up signal PU, and a pull-down signal generating circuit 67 for generating the pull-down signal PD.

The pull-up signal generating circuit 66 includes a NAND circuit 68, an inverter 69, and a transfer gate circuit 70. The NAND circuit 68 performs a NAND operation on the output enable signal OEN1 and the output PSD1 of the PS conversion circuit 35. The inverter 69 inverts the output clock OCLK1. The transfer gate circuit 70 is turned ON/OFF by the output clock signal OCLK1 and the output of the inverter 69.

The pull-up signal generating circuit 66 also includes a NAND circuit 71, an inverter 72, and a transfer gate circuit 73.

The NAND circuit 71 performs a NAND operation on the output enable signal OEN2 and the output PSD2 of the PS conversion circuit 35. The inverter 72 inverts the output clock signal OCLK2. The transfer gate circuit 73 is turned ON/OFF by the output clock signal OCLK2 and the output of the inverter 72.

The pull-up signal generating circuit 66 includes a latch circuit 74, and an inverter 77. The latch circuit 74 is made up of inverters 75 and 76, and serially latches the outputs of the NAND circuits 68 and 71 via the transfer gate circuits 70 and 73, respectively. The inverter 77 inverts the output of the latch circuit 74, and thus produces the pull-up signal PU.

The pull-down signal generating circuit 67 includes an inverter 78, a NOR circuit 79, an inverter 80, and a transfer gate circuit 81. The inverter 78 inverts the output enable signal OEN1. The NOR circuit 79 performs a NOR operation on the output of the inverter 78 and the output PSD1 of the PS conversion circuit 35. The inverter 80 inverts the output clock signal OCLK1. The transfer gate circuit 81 is turned ON/OFF by the output clock signal OCLK1 and the output of the inverter 80.

The pull-down signal generating circuit 82 includes an inverter 82, a NOR circuit 83, an inverter 84, and a transfer gate circuit 85. The inverter 82 inverts the output enable signal OEN2. The NOR circuit 83 performs a NOR operation on the output of the inverter 82 and the output PSD2 of the PS conversion circuit 35. The inverter 84 inverts the output clock signal OCLK2. The transfer gate circuit 85 is turned ON/OFF by the output clock signal OCLK2 and the output of the inverter 84.

The pull-down signal generating circuit 82 includes a latch circuit 86, and an inverter 89. The latch circuit 86 is made up of inverters 87 and 88, and serially latches the outputs of the NOR circuits 79 and 83 via the transfer gate circuits 81 and 85, respectively. The inverter 89 inverts the output of the latch circuit 86, and thus produces the pull-down signal PD.

In the output transistor control circuit 41 thus configured, when the output enable signals OEN1 and OEN2 are bot at L, the outputs of the NAND circuits 68 and 71 are at H, and the outputs of the inverters 78 and 82 are at H. Further, the outputs of the NOR circuits 79 and 83 are at L.

In the above state, when the output clock signal OCLK1 switches to L, the output of the latch circuit 74 is changed to L, and the pull-up signal PU is changed to H. The output of the latch circuit 86 is changed to H, and the pull-down signal PD is changed to L. Then, this state will not be changed even when the output clock signal OCLK1 switches to H and the output clock signal OCLK2 switches to L.

Thus, when the output clock signal OCLK1 switches to L in the case where the output enable signals OEN1 and OEN2 are bot at L, the PMOS transistor 39 is turned OFF and the NMOS transistor 40 is turned OFF. Thus, the output state is the high-impedance state.

When the output clock signal OCLK1 is at L and the output clock signal OCLK2 is at H, the transfer gate circuits 70 and 81 are ON, and the transfer gate circuits 73 and 85 are OFF.

When the output enable signal OEN1 is at H, the NAND circuit 68 and the NOR circuit 79 function as inverters with respect to the output PSD1 of the PS conversion circuit 35.

In this case, when the output PSD1 of the PS conversion circuit 35 is at H, the output of the NAND circuit 68 is at L, and the output of the latch circuit 74 is at H. Further, the pull-up signal PU is at L, and the output of the NOR circuit 79 is at L. The output of the latch circuit 86 is at H, and the pull-down signal PD is at L.

Thus, in the above case, the PMOS transistor 39 is ON, and the NMOS transistor 40 is OFF. Consequently, H that is the PSD1 of the PS conversion circuit 35 is output as the output data DOUT.

In contrast, when the output signal PSD1 of the PS conversion circuit 35 is at L, the output of the NAND circuit 68 is at H, and the output of the latch circuit 74 is at L. Thus, the pull-up signal PU is at H. The output of the NOR circuit 79 is at H, and the output of the latch circuit 86 is at L. Thus, the pull-down signal PD is at H.

Thus, in the above case, the PMOS transistor 39 is OFF, and the NMOS transistor 40 is ON. Consequently, L that is the output PSD1 of the PS conversion circuit 35 is output as output data DOUT.

When the output clock signal OCLK1 is at H and the output clock signal OCLK2 is at L, the transfer gate circuits 70 and 81 are OFF, and the transfer gate circuits 73 and 85 are ON.

When the output enable signal OEN2 is at H, the NAND circuit 71 and the NOR circuit 83 function as inverters with respect to the output PSD2 of the PS conversion circuit 35.

In this case, when the output PSD2 of the PS conversion circuit 35 is at H, the output of the NAND circuit 71 is at L, and the output of the latch circuit 74 is at H. Thus, the pull-up signal PU is at L. The output of the NOR circuit 83 is at L, and the output of the latch circuit 86 is at H. Thus, the pull-down signal PD is at L.

Thus, in the above case, the PMOS transistor 39 is ON, and the NMOS transistor 40 is OFF. Consequently, H that is the output PSD2 of the PS conversion circuit 35 is output as output data DOUT.

In contrast, when the output PSD2 of the PS conversion circuit 35 is at L, the output of the NAND circuit 71 is at H, and the output of the latch circuit 74 is at L. Thus, the pull-up signal PU is at H. The output of the NOR circuit 83 is at H, and the output of the latch circuit 86 is at L. Thus, the pull-down signal PD is at H.

Thus, in the above case, the PMOS transistor 39 is OFF, and the NMOS transistor 40 is ON. Consequently, L that is the output PSD2 of the PS conversion circuit 35 is output as output data DOUT.

FIG. 9 is a waveform diagram of an operation of the DRAM shown in FIG. 6 at the time of read in the normal mode. Part A of FIG. 9 shows external complementary clock signals CLK and /CLK supplied from the outside of the DRAM, and part B thereof shows the select signal SEL. Part C shows real data RD1 and RD2, and part D shows the PS conversion control signals PSCLK1 and PSCLK2. Part E shows the outputs PSD1 and PSD2 of the PS conversion circuit 35, and part F shows the output enable signals OEN1 and OEN2. Part G shows the output clock signals OCLK1 and OCLK2, and part H shows output data DOUT.

At the time of read in the normal mode, the select signal SEL is set at L, and the PS conversion circuit 35 is set to a state in which real data RD1 and RD2 can be output.

The real data RD1 and RD2 read in parallel from a memory cell area are applied to the PS conversion circuit 35, and are serially read therefrom in synchronism with the rising edges of the PS conversion control signals PSCLK1 and PSCLK2 applied thereto in order. The real data RD1 and RD2 thus read out are serially transmitted to the output buffer circuit 36 as the outputs PSD1 and PSD2 of the PS conversion circuit 35, respectively.

In the output buffer circuit 36, when the output enable signal OEN1 switches to H, the real data RD1 is output to the pad 37 as the output data DOUT in synchronism with the falling timing of the output clock signal OCLK1. Thereafter, when the output enable signal OEN2 switches to H, the real data RD2 is output to the pad as the output data DOUT in synchronism with the falling timing of the output clock signal OCLK2.

FIG. 10 is a waveform diagram illustrating an operation of the DRAM shown in FIG. 6 at the time of the test mode.

Part A of FIG. 10 shows the external complementary clock signals CLK and /CLK, and part B shows the select signal SEL. Part C shows test data TD, and part D shows the PS conversion control signals PSCLK1 and PSCLK2. Part E shows the outputs PSD1 and PSD2 of the PS conversion circuit 35, and part F shows the output enable signals OEN1 and OEN2. Part G shows the output clock signals OCLK1 and OCLK2, and part H shows output data DOUT.

At the time of the test mode, the select signal SEL is set at H, so that the PS conversion circuit 35 is set to a state in which the test data TD can be output.

The test data TD is input to the PS conversion circuit 35, which outputs, outputs PSD1 and PSD2 of the circuit 35, the test data TD to the output buffer circuit 36 in synchronism with the rising timings of the PS conversion control signals PSCLK1 and PSCLK2 sequentially applied to the circuit 35.

In the output buffer circuit 36, when the output enable signal OEN1 switches to H, the test data TD that is input as the output PSD1 of the PS conversion circuit 35 is output, as output data DOUT, to the pad 37 in synchronism with the falling timing of the output clock signal OCLK1.

Then, when the output enable signal OEN2 switches to H, the test data TD that is input as the output PSD2 of the PS conversion circuit 35 is output, as output data DOUT, to the pad 37 in synchronism with the falling timing of the output clock signal OCLK2.

As described above, the DRAM shown in FIG. 6 operates in a different manner from that of the DRAM shown in FIG. 1. More particularly, the DRAM shown in FIG. 6 reads the real data RD1 and RD2 from the memory cell area in parallel formation, and serially outputs the read data RD1 and RD2 thus read to the outside of the DRAM. Thus, it is possible to speed up the DRAM operation. In addition, it is possible to output the test data that is output from a part other than the memory cell area to the outside of the DRAM via the data output circuit.

However, the DRAM shown in FIG. 6 has the following disadvantage. That is, a wiring line 92 for transferring the test data TD is connected to a path 91 for transferring the real data RD1. Thus, a wiring capacitance of the wiring line 92 for the test data TD serves as a load of the path 91, and reduces the speed of transfer of the read data RD1, so that the RAS access time (tRAC) becomes long.

SUMMARY OF THE INVENTION

It is an object of the present invention to provide a semiconductor device in which the above disadvantage is eliminated.

A more specific object of the present invention is to provide a semiconductor device capable of outputting first (leading) data of a series of pieces of data (serial data) with a reduced time.

The above objects of the present invention are achieved by a semiconductor device comprising: first through nth paths (where n is an integer greater than or equal to 2) to which first data through nth data are respectively applied; and a data output circuit converting the first data through the nth data into serial data in which the first data through the nth data are serially arranged in this order in a first operating mode, (n+t)th data to be output to an outside of the semiconductor device being applied to one of the second through nth paths in a second operating mode.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
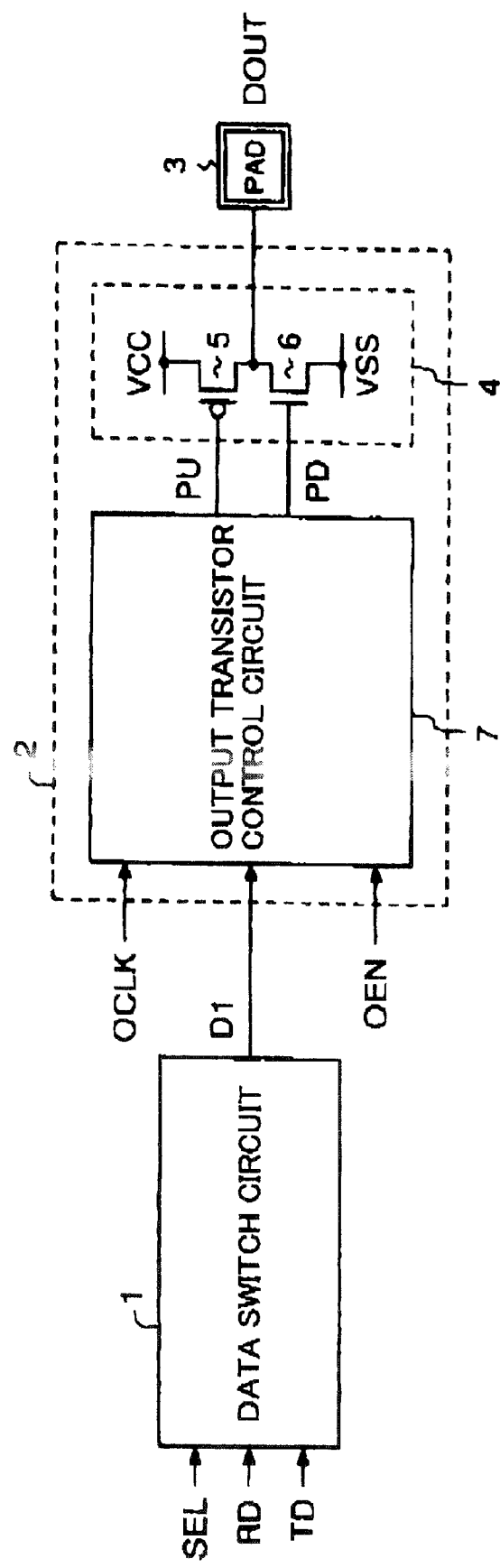
FIG. 1 is a circuit diagram of part of an example of a conventional DRAM.
Figure 2:
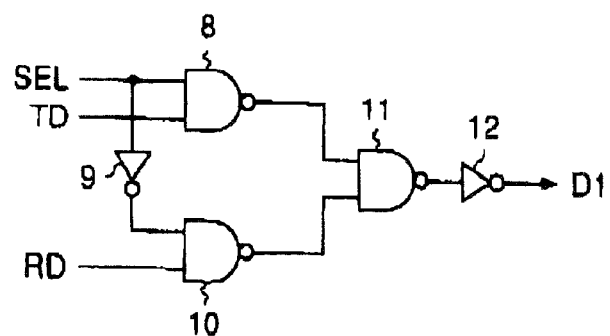
FIG. 2 is a circuit diagram of a configuration of a data switch circuit shown in FIG. 1.
Figure 3:
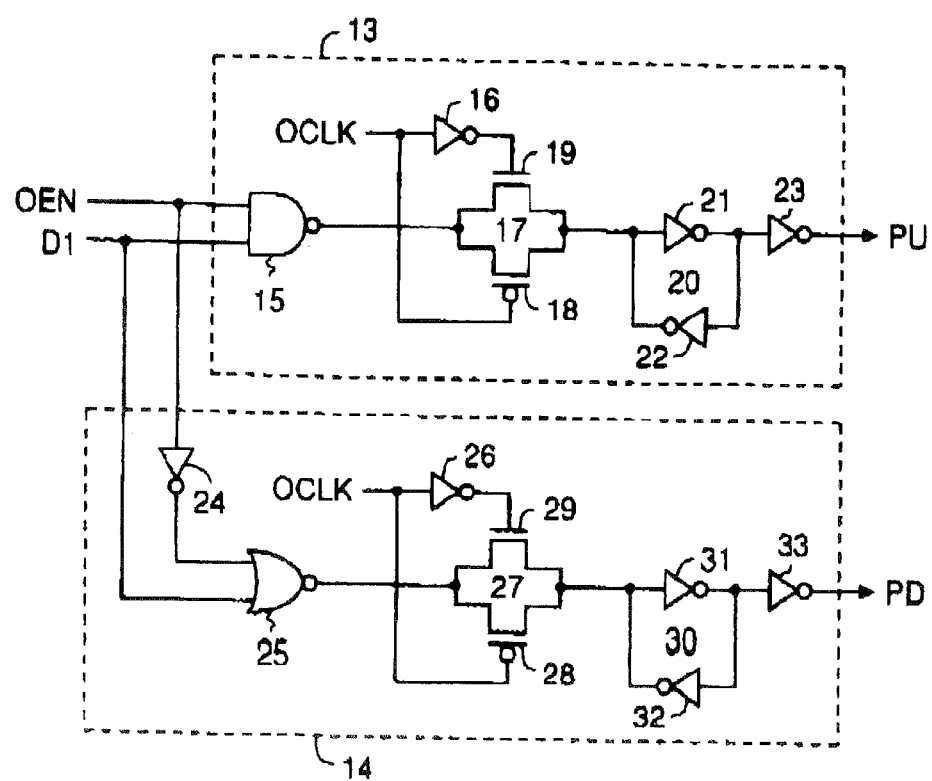
FIG. 3 is a circuit diagram of a configuration of an output transistor control circuit shown in FIG. 1.
Figure 4:
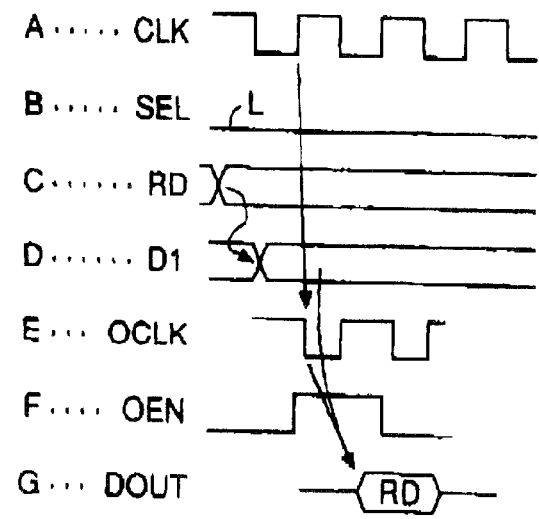
FIG. 4 is a waveform diagram of an operation of the DRAM shown in FIG. 1 at the time of read in a normal mode.
Figure 5:
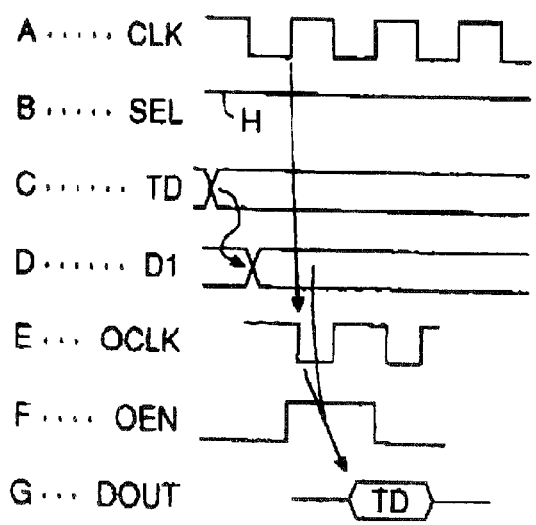
FIG. 5 is a waveform diagram of an operation of the DRAM shown in FIG. 1 at the time of a test mode.
Figure 6:
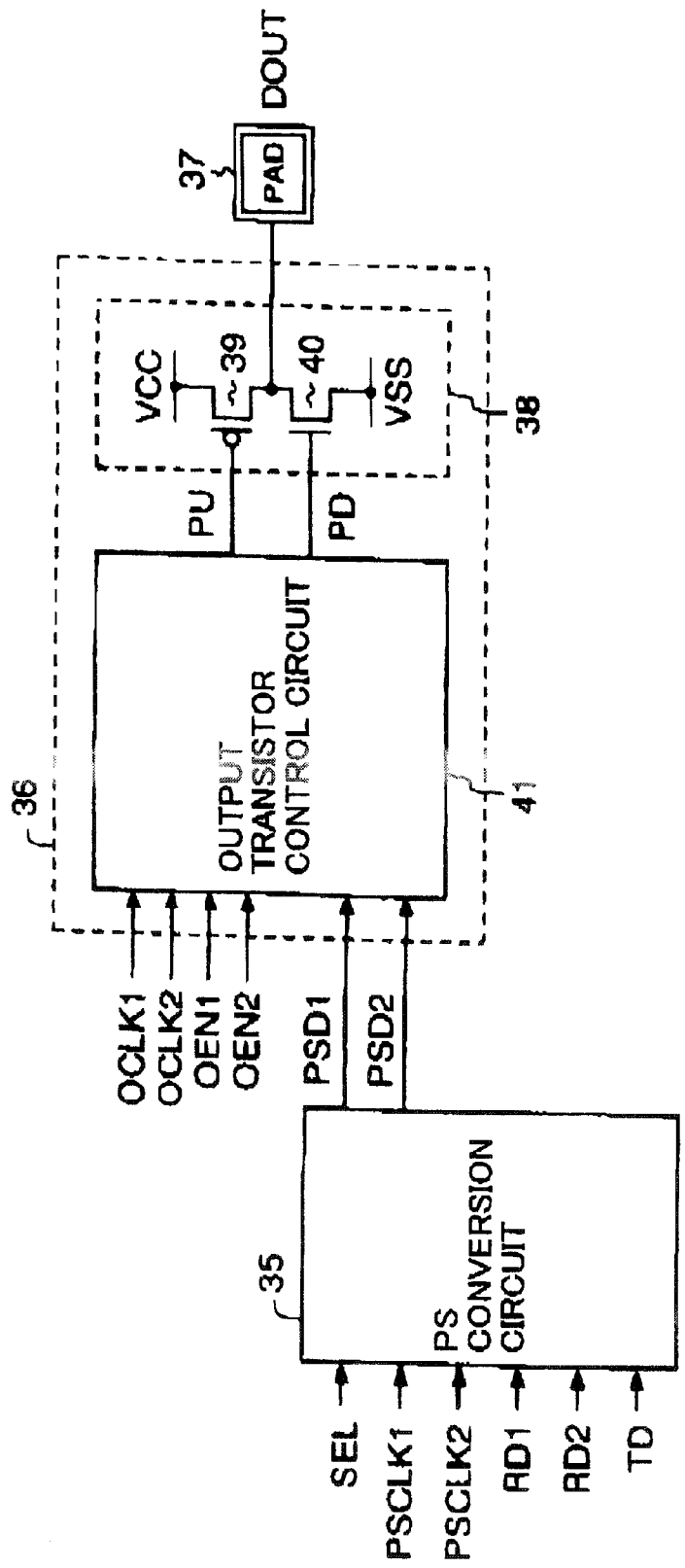
FIG. 6 is a circuit diagram of a part of another example of the conventional DRAM.
Figure 7:
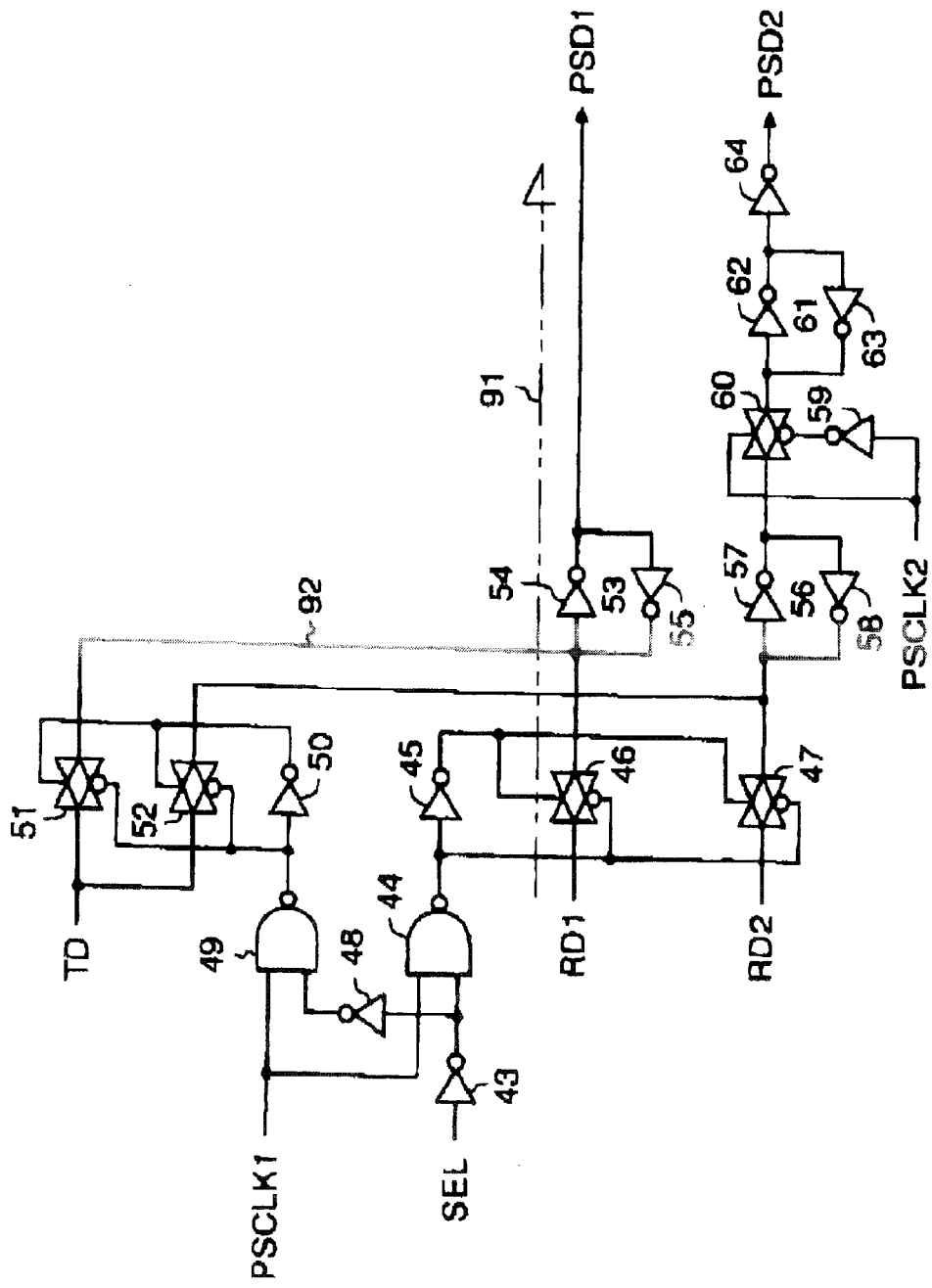
FIG. 7 is a circuit diagram of a PS conversion circuit shown in FIG. 6.
Figure 8:
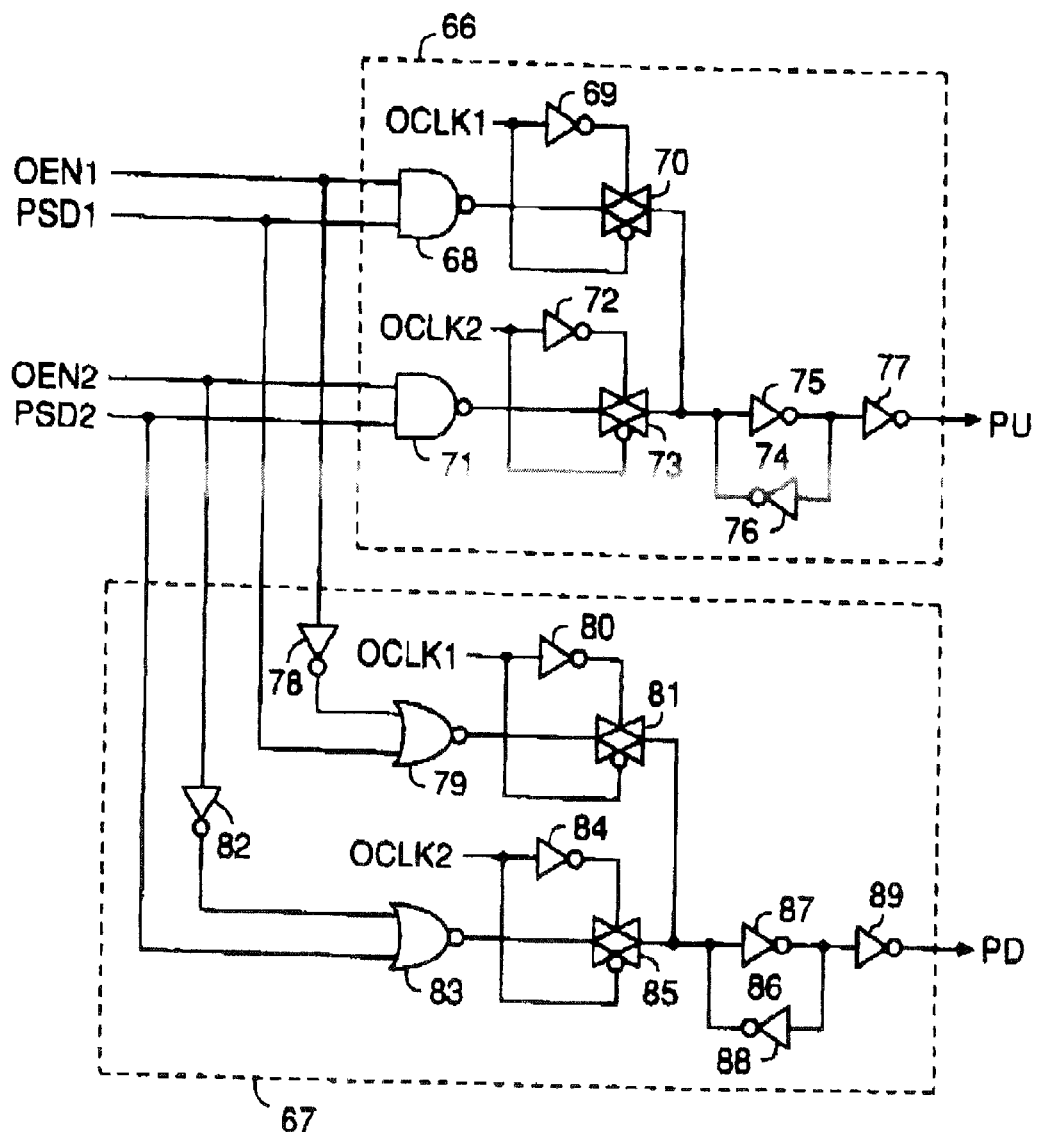
FIG. 8 is a circuit diagram of a configuration of an output transistor control circuit shown in FIG. 6.
Figure 9:
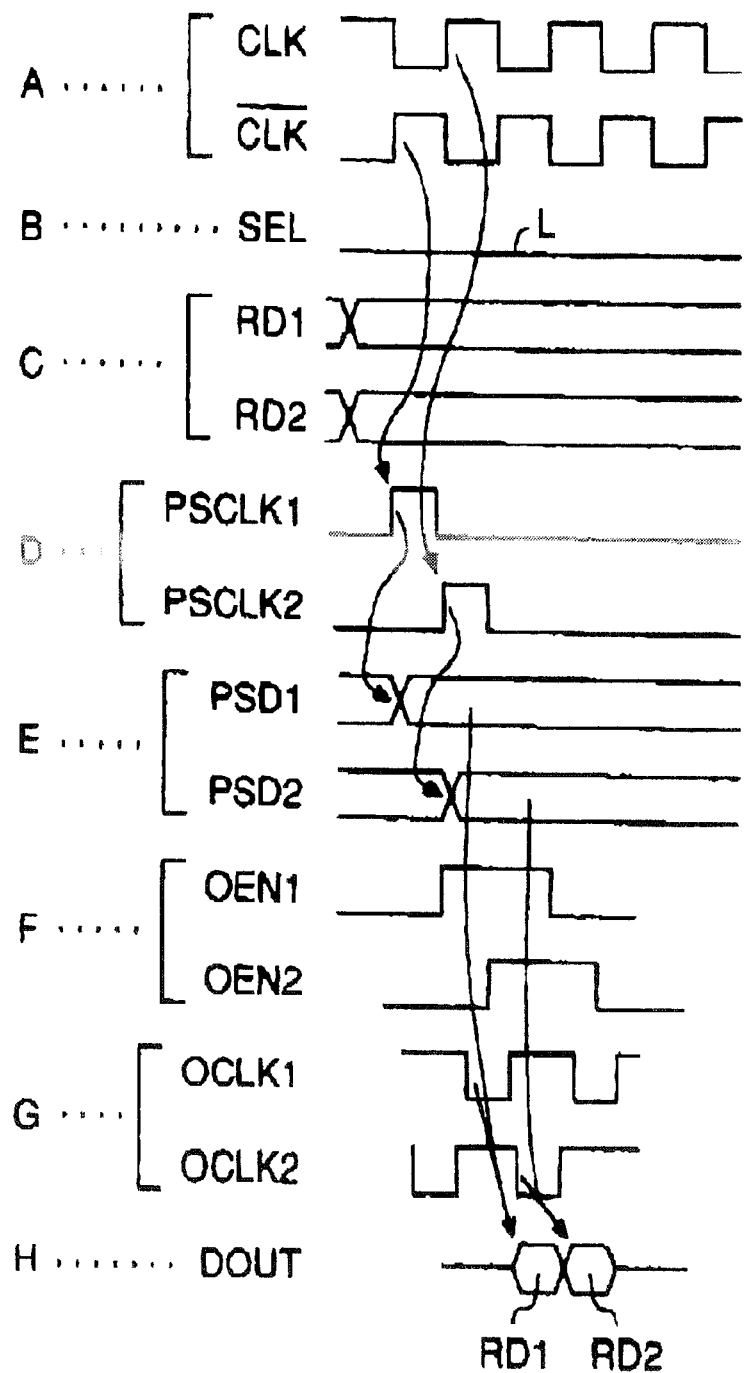
FIG. 9 is a waveform diagram of an operation of the DRAM shown in FIG. 6 at the time of read in the normal operation.
Figure 10:
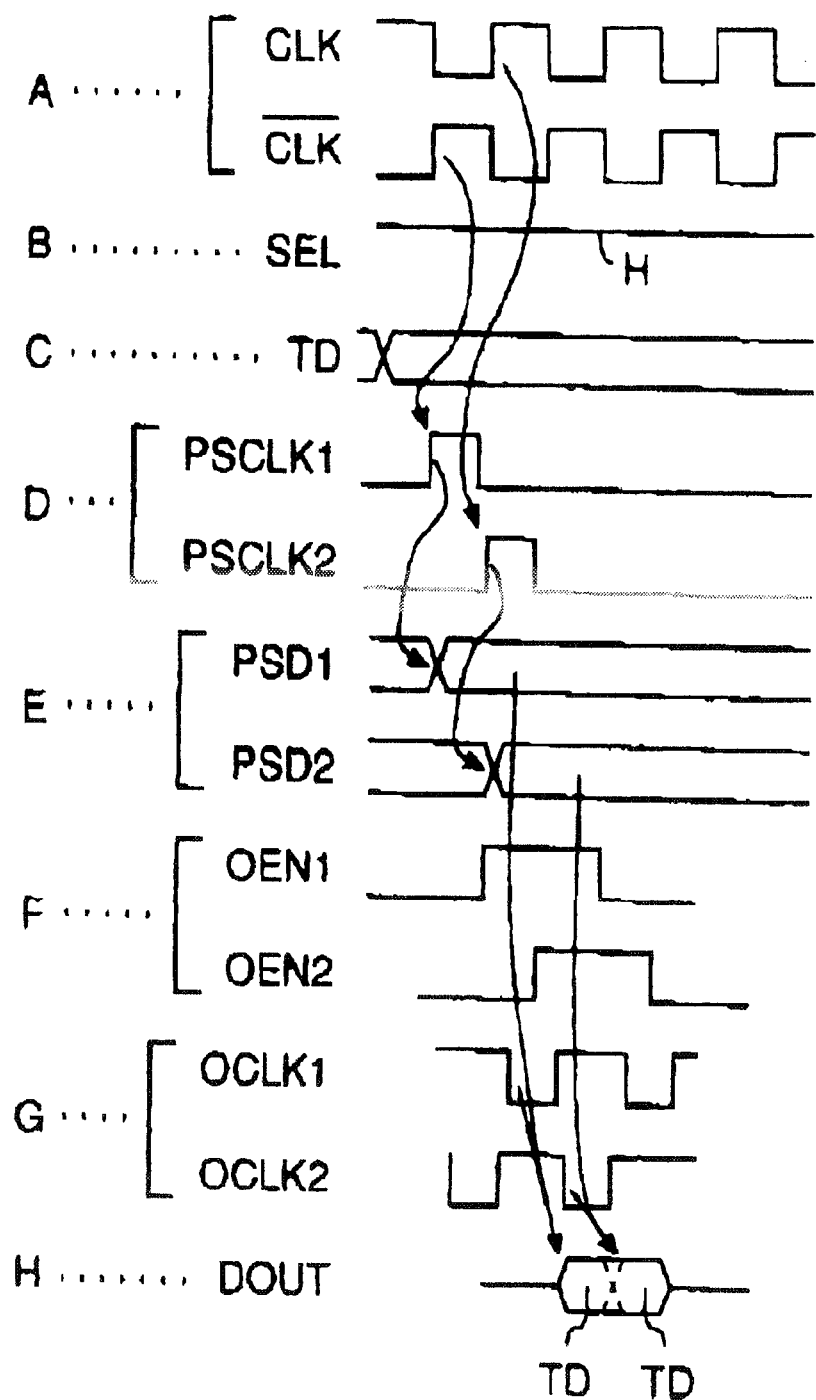
FIG. 10 is a waveform diagram of an operation of the DRAM shown in FIG. 6 at the time of the test mode.

A description will be given of an embodiment of the present invention with reference to FIGS. 11 through 15 In FIGS. 11 through 13, any parts shown therein that are the same as those shown in FIGS. 6 through 8 are denoted by the same reference numbers in these figures.

Figure 11:
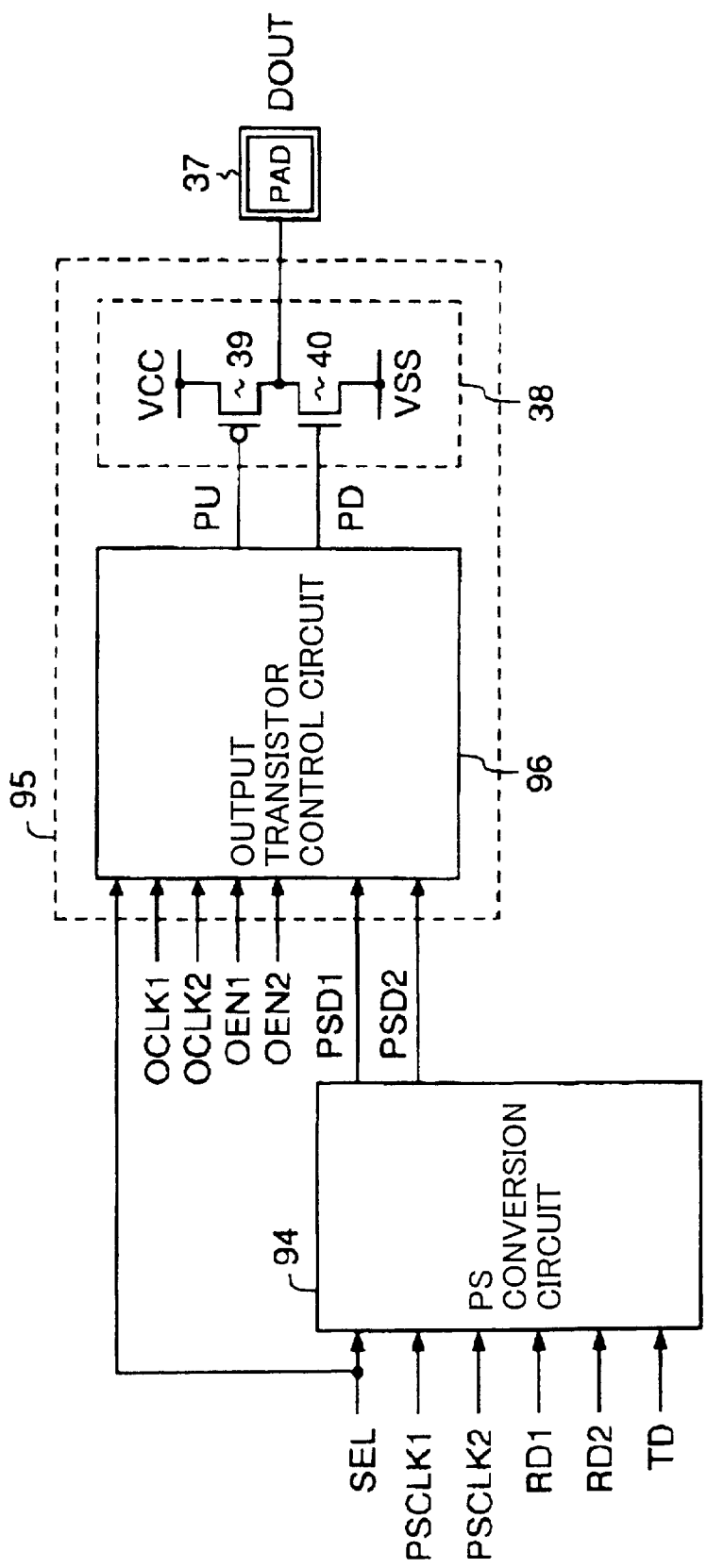
FIG. 11 is a block diagram of a part of an embodiment of the present invention.

FIG. 11 is a circuit diagram of a part (data output circuit) of a DRAM according to an embodiment of the present invention. The configuration shown in FIG. 11 differs from that shown in FIG. 6 in that the former configuration is equipped with a PS conversion circuit 94 and an output buffer circuit 95 have configurations different from those of the PS conversion circuit 35 and the output buffer circuit 36 shown in FIG. 6.

Figure 12:
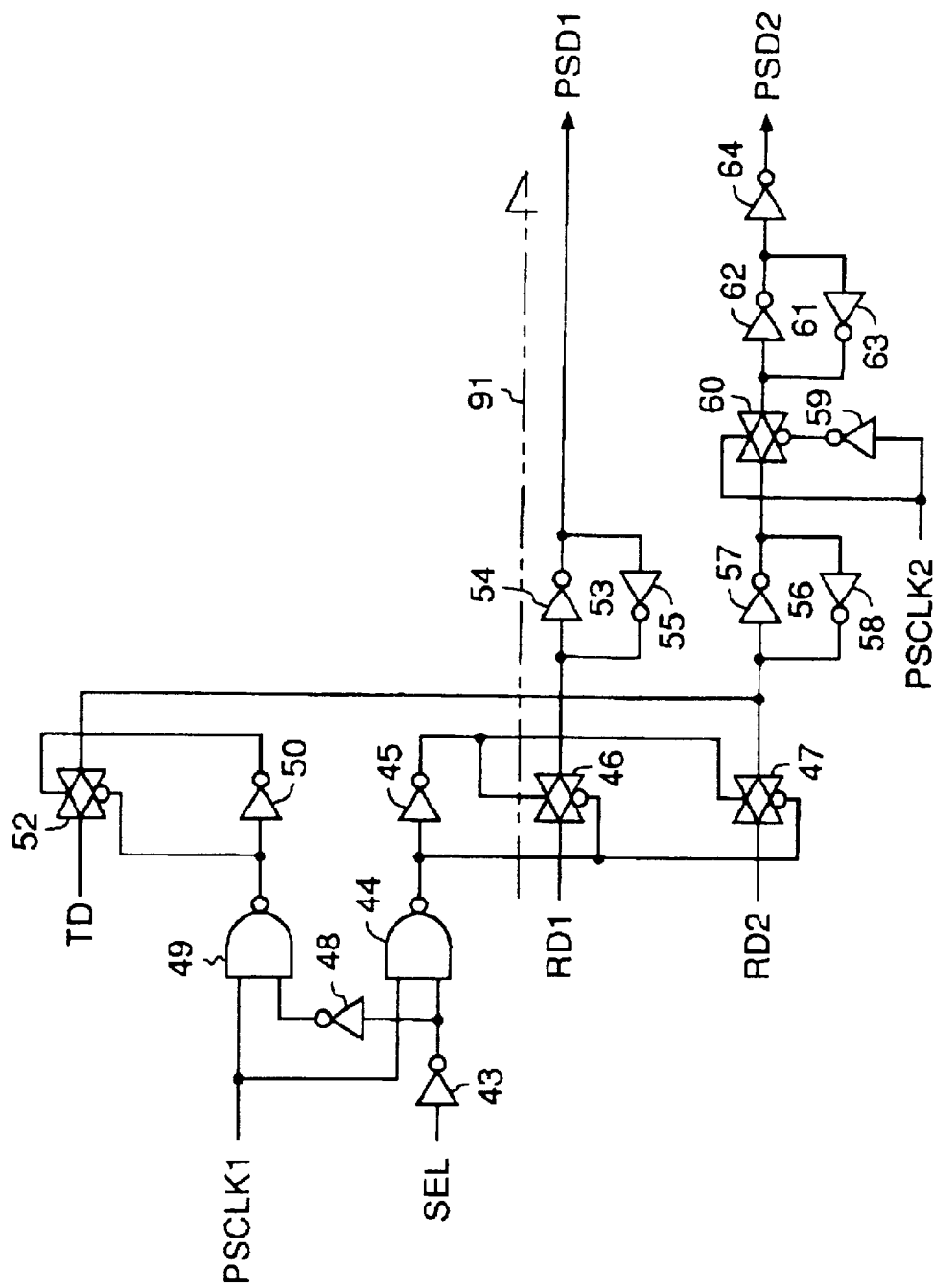
FIG. 12 is a circuit diagram of a PS conversion circuit shown in FIG. 11.

FIG. 12 is a circuit diagram of the PS conversion circuit 94, which does not employ the transfer gate circuit 51 and wiring line 92 used in the conventional PS conversion circuit 35 shown in FIG. 7. The remainder parts of the circuit 94 are the same as those of the circuit 35.

In the PS conversion circuit 94, when the select signal SEL is at L, the output of the inverter 43 is at H. The NAND circuit 44 functions as an inverter with respect to the PS conversion control signal PSCLK1. The output of the inverter 48 is at L, and the output of the NAND circuit 49 is at H. The output of the inverter 50 is at L. Thus, the transferred gate circuit 52 is OFF.

In the above state, when the PS conversion control signal PSCLK1 switches to H while the PS conversion control signal PSCLK2 is maintained at L, the output of the NAND circuit 44 is changed to L, and the output of the inverter 45 is changed to H. Thus, the transfer gate circuits 46 and 47 are turned ON. The real data RD1 and RD2 are latched in the latch circuits 53 and 56, respectively. The output of the latch circuit 53 is output as output PSD1 of the PS conversion circuit 94.

Then, when the PS conversion control signal PSCLK1 switches to L and the PS conversion control signal PSCLK2 switches to H, the transfer gate circuits 46 and 47 are turned OFF, and the transfer gate circuit 60 is turned ON. Thus, the output of the latch circuit 56 is latched in the latch circuit 61, and the output of the inverter 64 obtained by inverting the output of the latch circuit 61 is output as output PSD2 of the PS conversion circuit 94.

When the select signal SEL is at H, the output of the inverter 43 is at L, and the output of the NAND circuit 44 is at H. The output of the inverter 45 is at L. Thus, the transfer gate circuits 46 and 47 are turned OFF, and the output of the inverter 48 is at H. Thus, the NAND circuit 49 functions as an inverter with respect to the PS conversion control signal PSCLK1.

In the above state, when the PS conversion control signal PSCLK1 changes to H, while the PS conversion control signal PSCLK2 is maintained at L, the output of the NAND circuit 49 changes to L, and the output of the inverter 50 changes to H. Thus, the transfer gate circuit 52 is turned ON. Thus, the test data TD is latched in the latch circuit 56.

Then, when the PS conversion control signal PSCLK1 switches to L and the PS conversion control signal PSCLK2 switches to H, the transfer gate circuit 52 is turned OFF, and the transfer gate circuit 60 is turned ON. Thus, the output of the latch circuit 56 is latched in the latch circuit 61. The output of the inverter 64 obtained by inverting the output of the latch circuit 61 is output as output PSD2 of the PS conversion circuit 94.

The output buffer circuit 95 is equipped with an output transistor control circuit 96 having a configuration different from that of the output transistor control circuit 41 provided in the output buffer circuit 36 shown in FIG. 6. The remainder parts of the circuit 95 are the same as those of the circuit 41.

Figure 13:
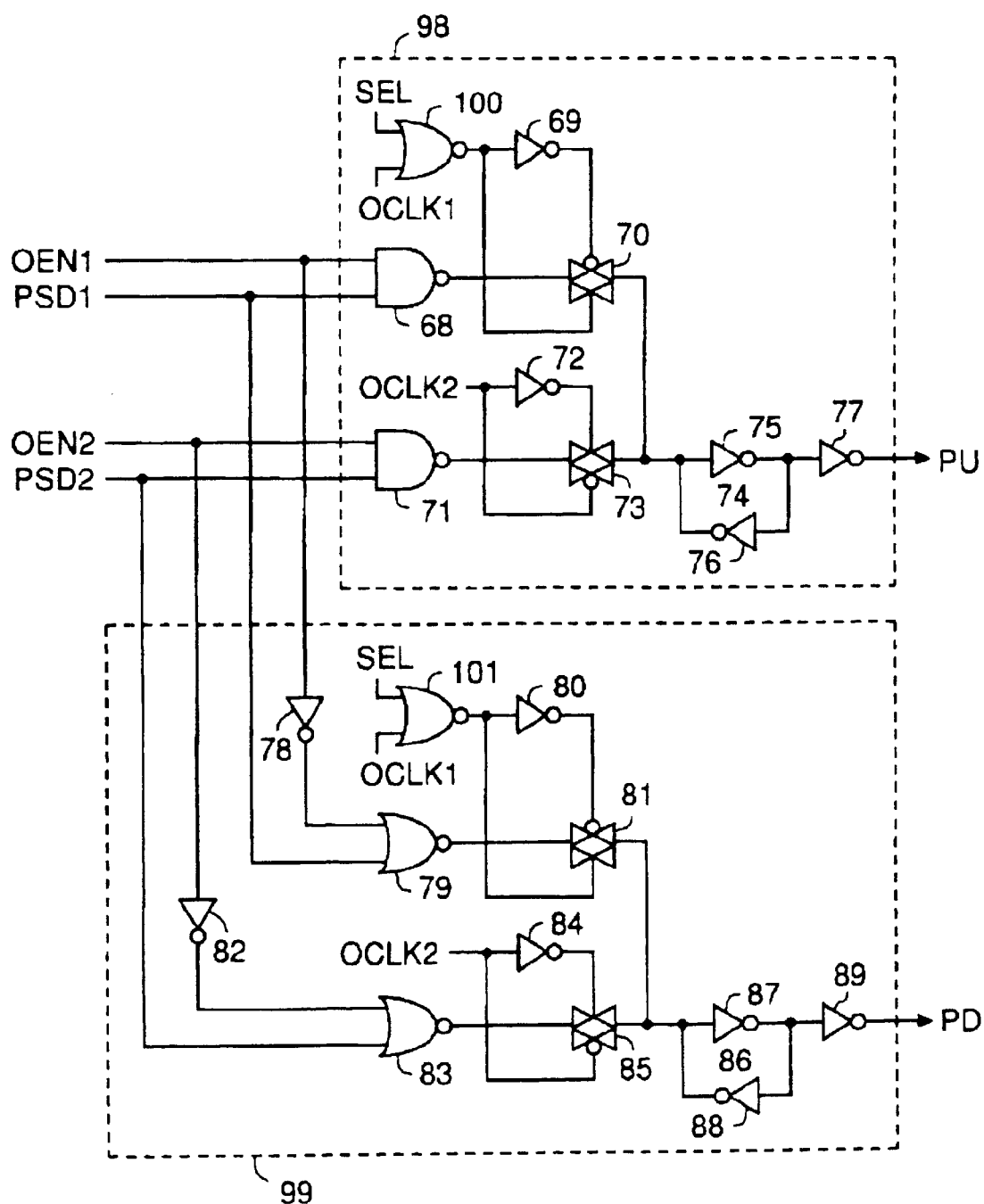
FIG. 13 is a circuit diagram of an output transistor control circuit shown in FIG. 11.

FIG. 13 is a circuit diagram of the output transistor circuit 96, which includes a pull-up signal generating circuit 98 for generating the pull-up signal PU, and a pull-down signal generating circuit 99 for generating the pull-down signal.

The pull-up signal generating circuit 98 is equipped with a NOR circuit 100, which performs a NOR operation on the select signal SEL and the output clock signal OCLK1. The output of the NOR circuit 100 is inverted by the inverter 69. The output of the NOR circuit 100 controls to turn ON/OFF the NMOS transistors forming the transfer gate circuit 70. The output of the inverter 69 controls to turn ON/OFF the PMOS transistors forming the transfer gate circuit 70. The remainder parts of the circuit 98 are the same as those of the circuit 66 shown in FIG. 8.

The pull-down signal generating circuit 99 is equipped with a NOR circuit 101, which performs a NOR operation on the select signal SEL and the output clock signal OCLK1. The output of the NOR circuit 101 is inverted by the inverter 80. The output of the NOR circuit 101 controls to turn OF/OFF the NMOS transistors forming the transfer gate circuit 81. The output of the inverter 80 controls to turn ON/OFF the PMOS transistors forming the transfer gate circuit 81. The remainder parts of the circuit 99 are the same as those of the circuit 67.

In the output transistor control circuit 96 thus configured, when the select signal SEL is at L (at the time of the normal read mode), the NOR circuits 100 and 101 function as inverters with respect to the output clock signal OCLK1. Thus, the circuit 96 operates in the same manner as the circuit 41.

In contrast, when the select signal SEL is at H (at the time of test data), the NOR circuits 100 and 101 are at L, and the outputs of the inverters 69 and 80 are at H. Thus, the transfer gate circuits 70 and 81 are OFF. Thus, the output PSD1 of the PS conversion circuit 94 is not output as output data DOUT, but only the output PSD2 of the PS conversion circuit 94 is output as output data DOUT in synchronism with the falling timing of the output clock signal OCLK2.

Figure 14:
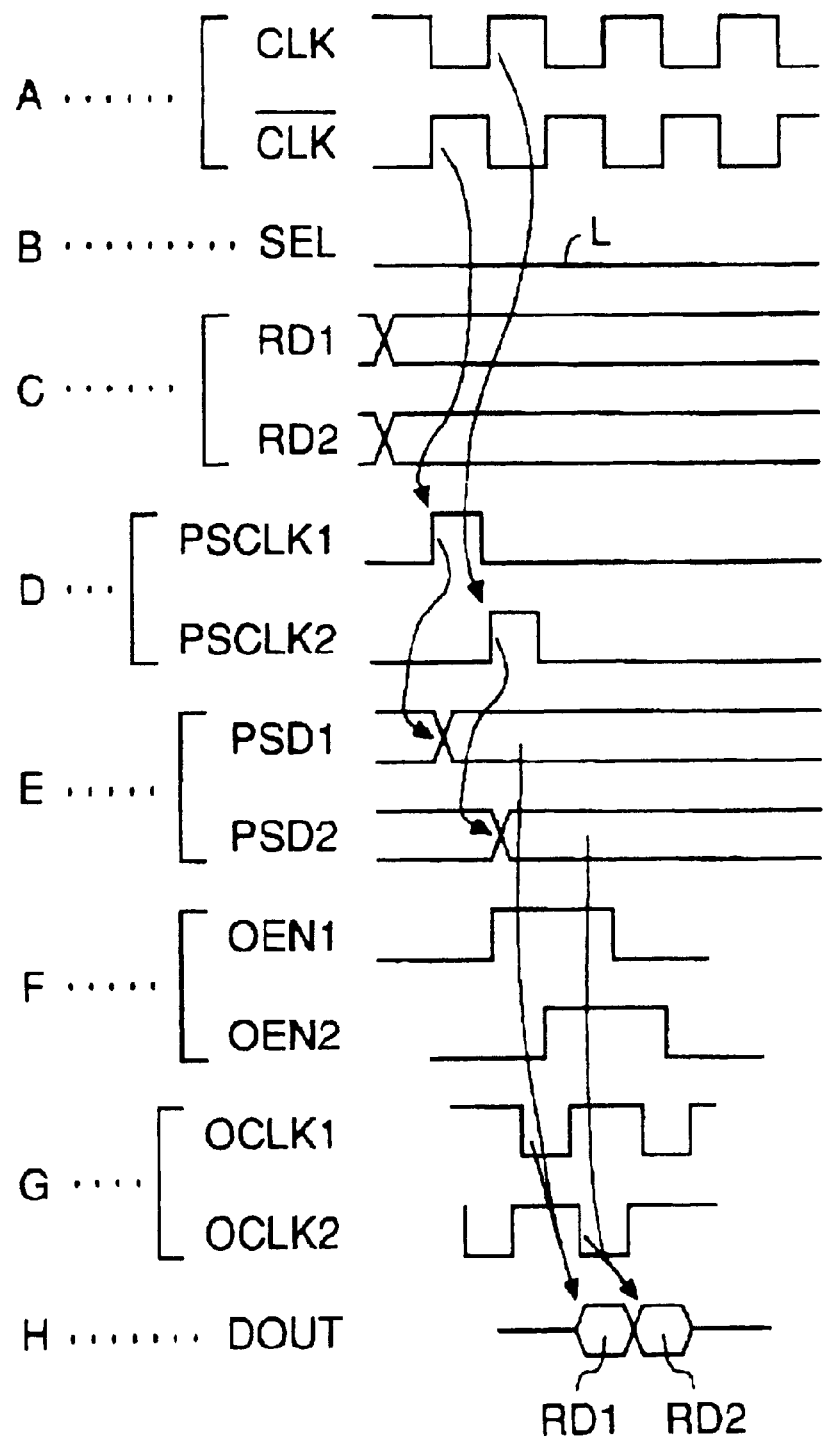
FIG. 14 is a waveform diagram of an operation of the device shown in FIG. 11 at the time of read in a normal mode.

FIG. 14 is a waveform diagram of an operation of the DRAM according to the embodiment of the invention at the time of read in the normal mode. Part A of FIG. 14 shows the external complementary clock signals CLK and /CLK, and part B thereof shows the select signal SEL. Part C shows real data RD1 and RD2, and part D shows the PS conversion control signals PSCLK1 and PSCLK2. Part E shows outputs PSD1 and PSD2 of the PS conversion circuit 94, and part F shows the output enable signals OEN1 and OEN2. Part G shows the output clock signals OCLK1 and OCLK2, and part H shows the output data DOUT.

At the time of read in the normal mode, the select signal SEL is set at L, so that the PS conversion circuit 94 is set to a state in which the real data RD1 and RD2 can be output.

The real data RD1 and RD2 that are read from the memory cell area in parallel are input to the PS conversion circuit 94, and are serially transferred, as outputs PSD1 and PSD2 of the circuit 94, to the output buffer circuit 95 in synchronism with the rising timings of the PS conversion control signals PSCLK1 and PSCLK2.

In the output buffer circuit 95, when the output enable signal OEN1 switches to H, the real data RD1 is output to the pad 37 as output data DOUT in synchronism with the falling timing of the output clock signal OCLK1. Then, when the output enable signal OEN2 switches to H, the real data RD2 is output to the pad 37 as output data DOUT in synchronism with the output clock signal OCLK2.

Figure 15:
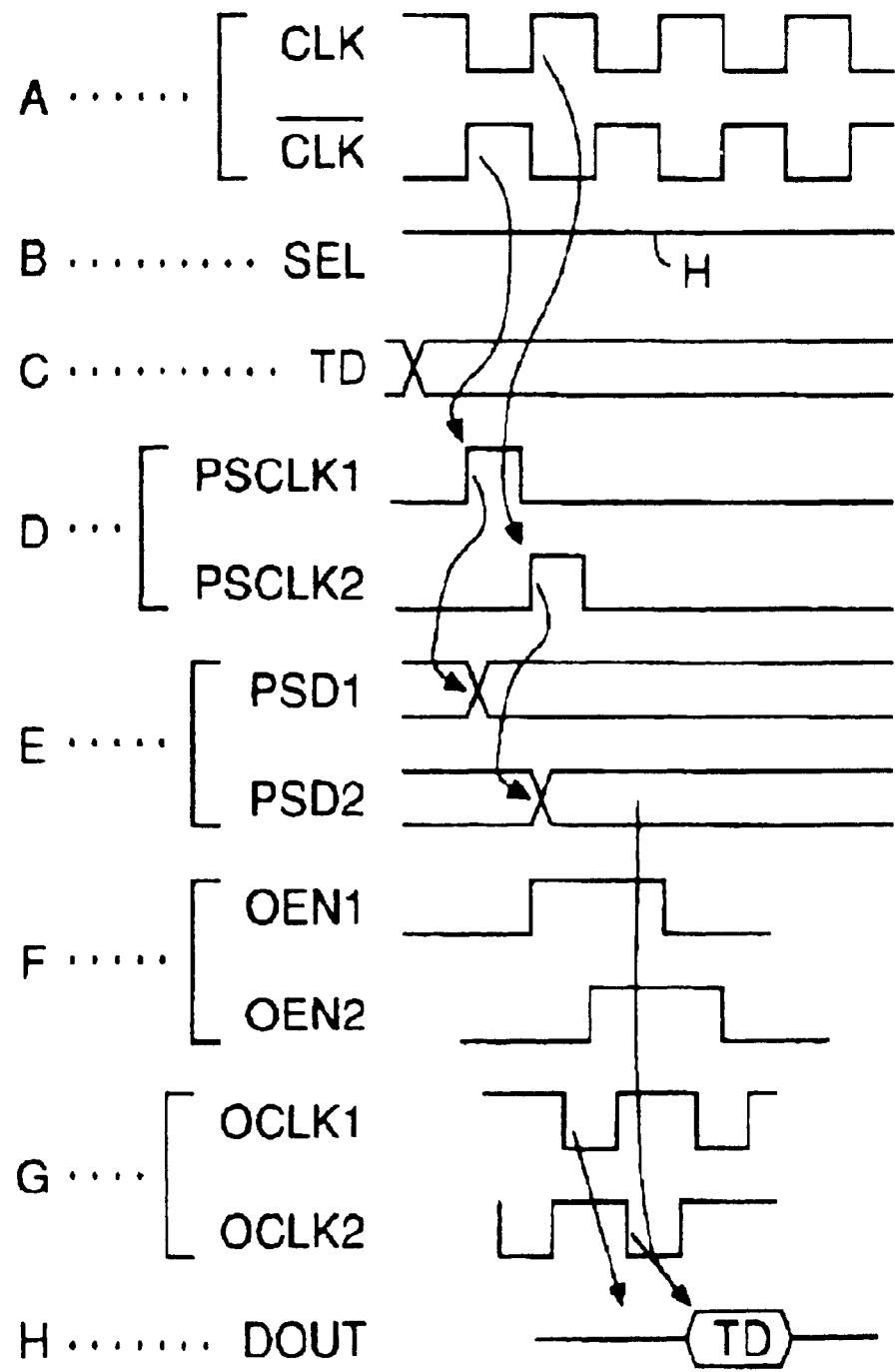
FIG. 15 is a waveform diagram of an operation of the device shown in FIG. 11 at the time of a test mode.

FIG. 15 is a waveform diagram of an operation of the DRAM according to the embodiment of the invention at the time of the test mode. Part A of FIG. 15 shows the external complementary clock signals CLK and /CLK, and part B shows the select signal SEL. Part C shows test data TD, and part D shows the PS conversion control signals PSCLK1 and PSCLK2. Part E shows the outputs PSD1 and PSD2 of the PS conversion circuit 94, and part F shows the output enable signals OEN1 and OEN2. Part G shows the output clock signals OCLK1 and OCLK2, and part H shows output data DOUT.

At the time of the test mode, the select signal SEL is set at H, so that the PS conversion circuit 94 selects the test data TD, which can be output.

The test data TD is input to the PS conversion circuit 94, and is output, as the output PSD2 thereof, to the pad 37 in synchronism with the rising timing of the PS conversion control signal PSCLK2 that is sequentially applied to the circuit 94.

According to the present embodiment, at the time of read in the normal mode, the real data RD1 and RD2 are read from the memory cell area in parallel, and are serialized before outputting the real data to the outside of the DRAM. Thus, the read operation speed can be increased. At the time of the test mode, test data TD that is output from a part other than the memory cell area is output to the outside of the DRAM via the data output circuit.

Also, as shown in FIG. 12, the wiring line for carrying the test data TD is not connected to the path 91 for transferring the real data RD1. Thus, the load capacitance of the path 91 can be reduced, and the real data RD1 can be transferred at a higher speed. Therefore, the RAS access time (tRAC) can be shortened and performance can be improved.

The output timing at which the test data TD is output to the outside of the DRAM coincides with the output timing at which the real data RD2 is output thereto, and thus lags behind the timing of the conventional DRAM. However, no program will arise because the test data is output to the outside of the DRAM at the time of the test mode.

In the above-mentioned embodiment of the invention, two items of real data RD1 and RD2 are read from the memory cell area in parallel. If three or more pieces of read data area read from the memory cell area, three or more paths are provided in the PS conversion circuit 94. Real data RD1–RDm are serialized so as to be arranged in the order of RD1, RD2, . . . , RDm. The test data TD is applied to a path (for example, a path for real data RD2) other than the part for the real data RD1. Thereby, the RAS access time can be reduced.

As described above, the present invention is a semiconductor device comprising: first through nth paths (where n is an integer greater than or equal to 2) to which first data through nth data are respectively applied; and a data output circuit converting the first data through the nth data into serial data in which the first data through the nth data are serially arranged in this order in a first operating mode, (n+t)th data to be output to an outside of the semiconductor device being applied to one of the second through nth paths in a second operating mode. It is to be noted that the first path has a comparatively reduced load capacitance because the (n+1)th data is not applied thereto. Thus, it is possible to reduce the time necessary to output the first data (the beginning data of a series of pieces of data, namely, serial data).

The present invention is not limited to the specifically disclosed embodiments, and variations and modifications may be made without departing from the scope of the present invention.

What is claimed is:

1. A semiconductor device comprising:
   conversion circuit that receives first through $n^{th}$ data (where n is an integer greater than or equal to 2), together with $(n+1)^{th}$ data, in parallel to each other, and that outputs the first through $n^{th}$ data via respective first through $n^{th}$ paths in series order in a first operating mode, while it outputs the $(n+1)^{th}$ data via one of the second through $n^{th}$ paths, without using the first path, in a second operation mode; and
   an output control circuit connected to the conversion circuit via the first through $n^{th}$ paths, the output control circuit successively outputting the first through $n^{th}$ data in the first operating mode, and outputting only the $(n+1)^{th}$ data supplied via said one of the second through $n^{th}$ path from the conversion circuit in the second operating mode.

2. The semiconductor device as claimed in claim 1, wherein:
   the output control circuit outputs the first data through the nth data in synchronism with first through nth timing signals in the first operating mode; and
   the output control circuit outputs the (n+1)th data in synchronism with the second through nth timing signals in the second operating mode.

3. The semiconductor device as claimed in claim 2, wherein the first operating mode is a normal mode and the second operating mode is a test mode.

4. The semiconductor device as claimed in claim 1, wherein the first operating mode is a normal mode and the second operating mode is a test mode.

5. The semiconductor device as claimed in claim 1, wherein:

the first data through the nth data are data read from a memory cell area; and the (n+1)th data is test data generated from an area other than the memory cell area.

6. A semiconductor device comprising:

first through nth paths (where n is an integer greater than or equal to 2) to which first data through nth data are respectively applied; and a data output circuit converting the first data through the nth data into serial data in which the first data through the nth data are serially arranged in this order in a first operating mode, and having an (n+1)th input path via which (n+t)th data to be output to an outside of the semiconductor device are received said (n+1)th input path being connected to one of the second through nth paths so that the (n+1)th data on the (n+1) input path are output via one of the second through nth paths, without using the first path, in a second operating mode.

* * * * *